United States Patent [19]
Kikuchi et al.

[11] Patent Number: 5,341,461
[45] Date of Patent: Aug. 23, 1994

[54] METHOD OF RENDERING A TWO DIMENSIONAL DRAWING INTO A THREE DIMENSIONAL DRAWING, USING A CAD PROGRAM

[75] Inventors: Fumio Kikuchi; Kazuo Itoh; Kazuharu Taga; Naoto Matsunaga; Hiroshi Ono; Takaoki Namba; Kazuhiko Narita, all of Sayama, Japan

[73] Assignee: Honda Giken Kogyo Kabushiki Kaisha, Tokyo, Japan

[21] Appl. No.: 671,215

[22] Filed: Mar. 18, 1991

[51] Int. Cl.$^5$ .............................................. G06F 15/72
[52] U.S. Cl. ..................................... 395/120; 395/123
[58] Field of Search ................. 395/120, 123, 155, 161

[56] References Cited

U.S. PATENT DOCUMENTS

| | | |
|---|---|---|
| 4,858,150 | 8/1989 | Aizawa et al. . |
| 4,868,766 | 9/1989 | Oosterholt ......................... 395/120 |
| 4,888,583 | 12/1989 | Ligocki et al. ................ 395/120 X |
| 4,897,638 | 1/1990 | Kokunishi et al. . |

FOREIGN PATENT DOCUMENTS

| | | |
|---|---|---|
| 0041854 | of 0000 | European Pat. Off. . |
| 0262304 | of 0000 | European Pat. Off. . |
| 2190268 | of 0000 | United Kingdom . |
| 2202659 | of 0000 | United Kingdom . |
| 2217958 | of 0000 | United Kingdom . |
| WO84/02993 | of 0000 | World Int. Prop. O. . |
| 89/09975 | of 0000 | World Int. Prop. O. . |

OTHER PUBLICATIONS

"An Editable Nonmanifold Boundary Representation" by Gary A. Crocker et al, IEEE CG&A, Mar., 1991, pp. 39–51.

"Hierarchical Data Structures and Algorithms for Computer Graphics," 8222 I.E.E.E. Computer Graphics and applications 8 (1988) Jul., No. 4, New York, N.Y., USA.

"Interactive Solid Design Through 2D Representations," 2334 The Transactions of the Institute of Electronics, Information & Communication Engineering, E70 (1987) Dec., No. 12, Tokyo, Japan.

"Handskizzierter Entwurf von CAD-Modellen mit CASUS," 4534 ZWF-Zeitschrift für wirtschaftlich Fertigung & Automatisierung 82 (1987) Juli, No. 7, München, W. Germany.

*Primary Examiner*—Mark K. Zimmerman

[57] ABSTRACT

Creating a solid (i.e. three dimensional) model with a CAD system, from a two dimensional representation, includes dividing the two dimensional representation into a plurality of shape portions, inputting them into the CAD system, rendering them solid, and then connecting them into the desired solid model. Among the shape portions are those whose cross-sections are substantially uniform. In inputting, the operator of the CAD system need only input line segments of the shape portions in approximately the correct orientation.

14 Claims, 29 Drawing Sheets

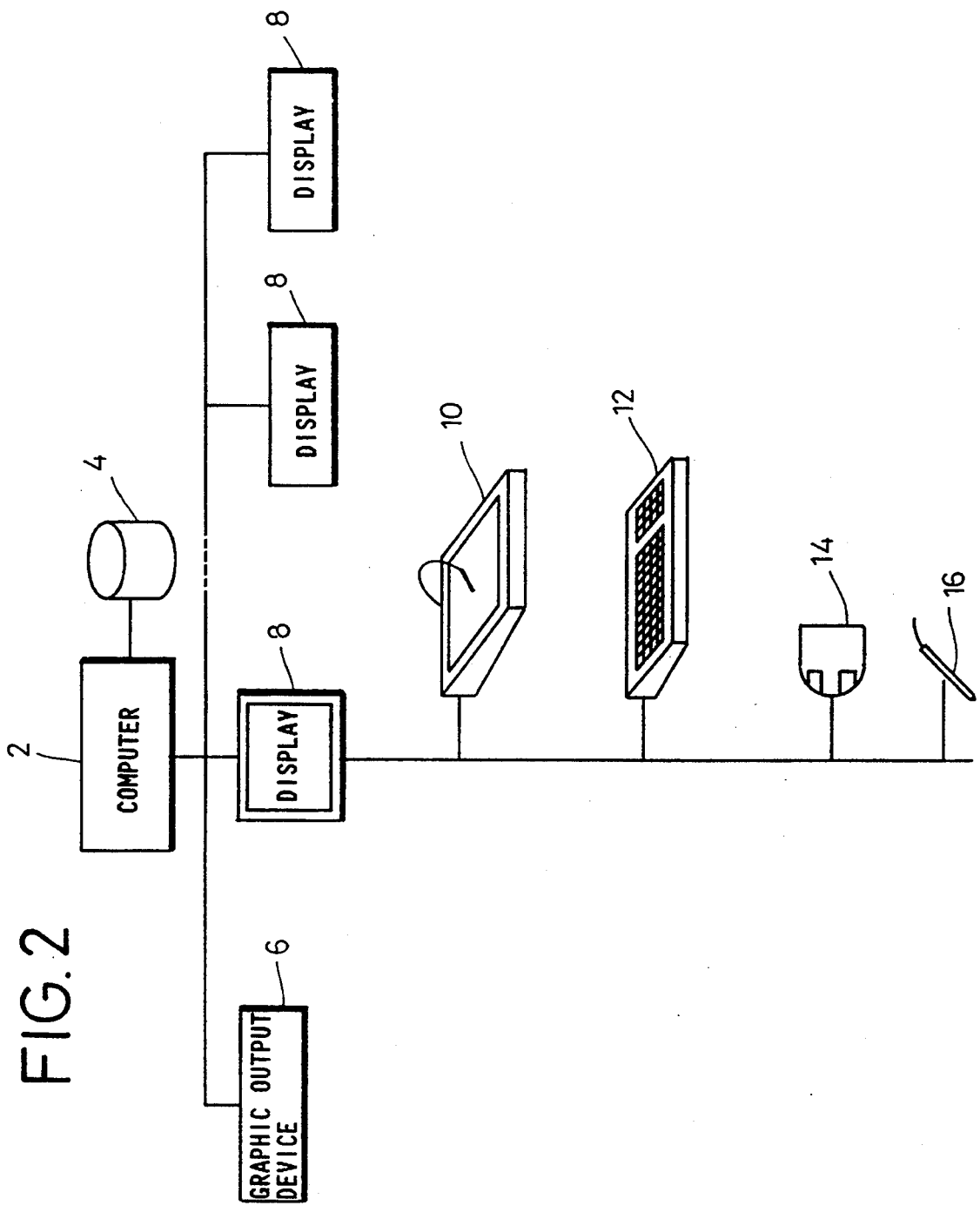

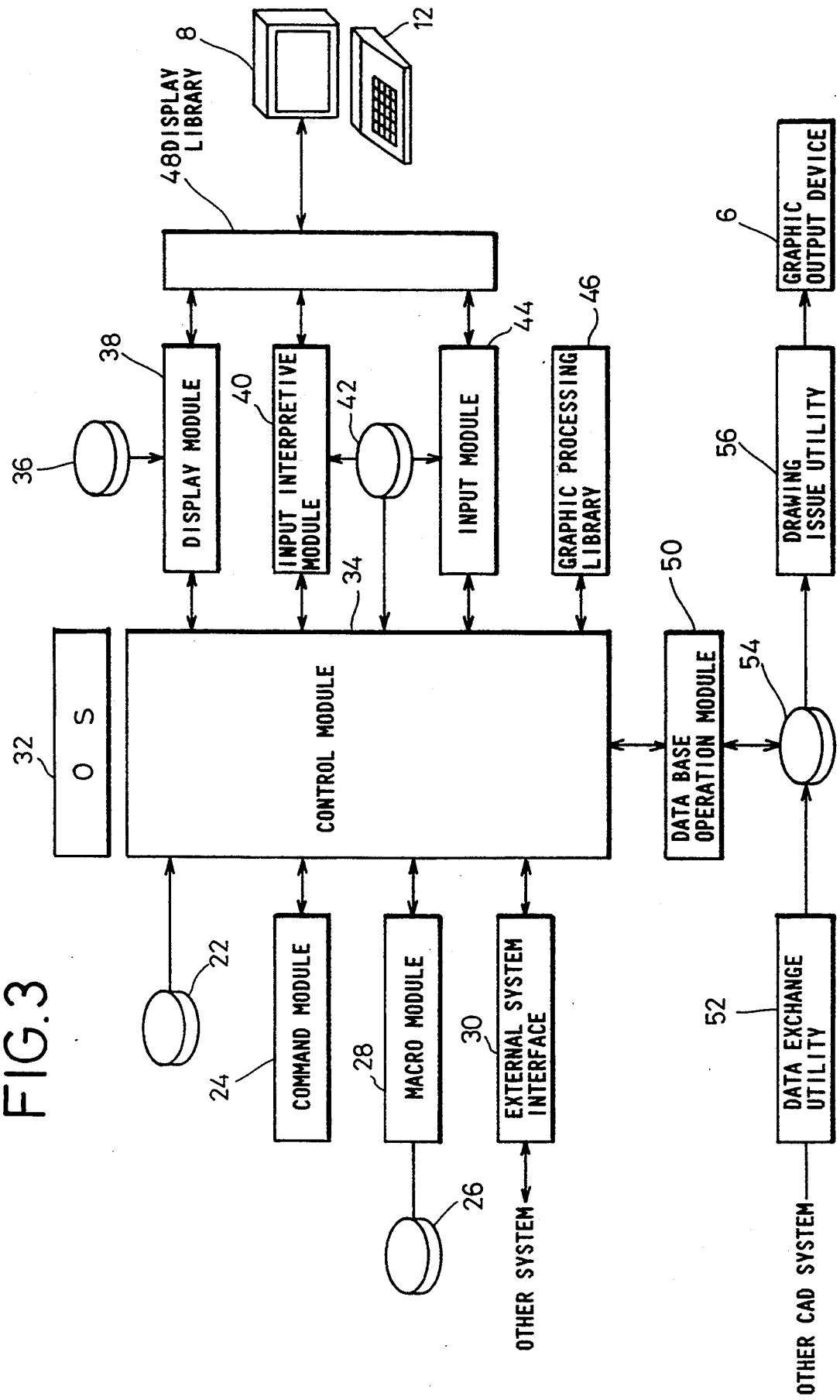

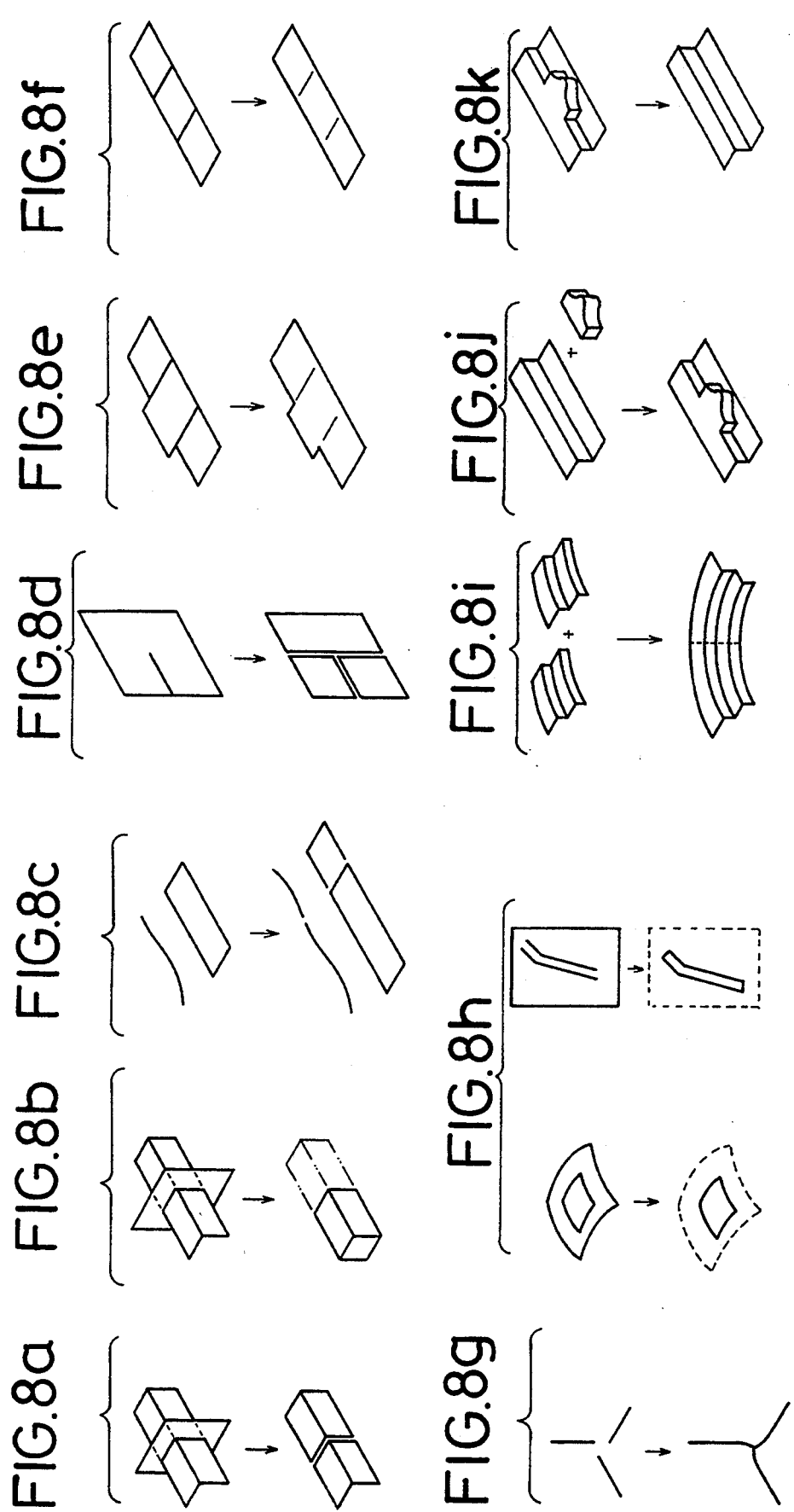

FIG.13
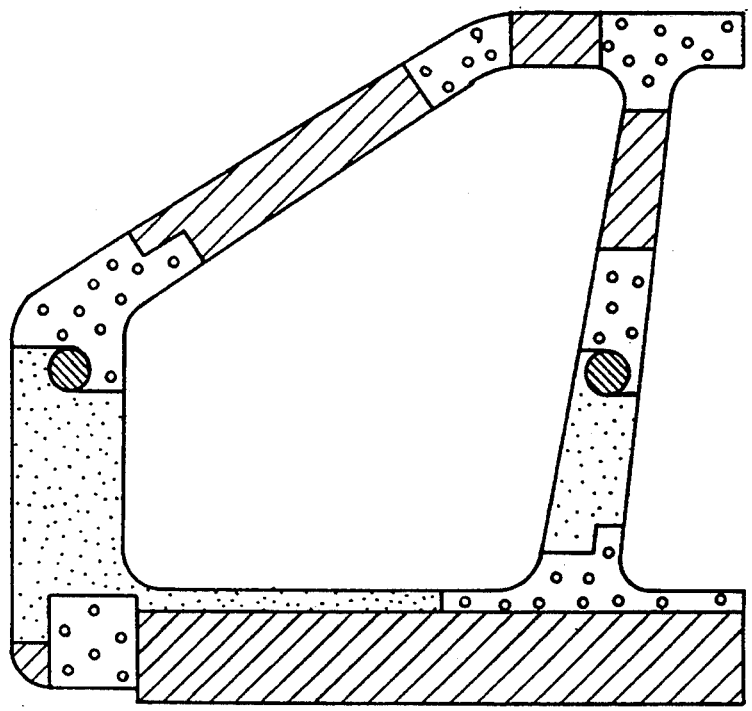
| SECTION BLOCK |  | CONNECTION BLOCK | 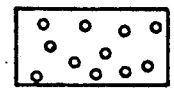 |
|---|---|---|---|
| VIEW BLOCK | 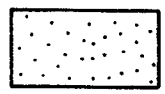 | KNOB BLOCK |  |

FIG. 20
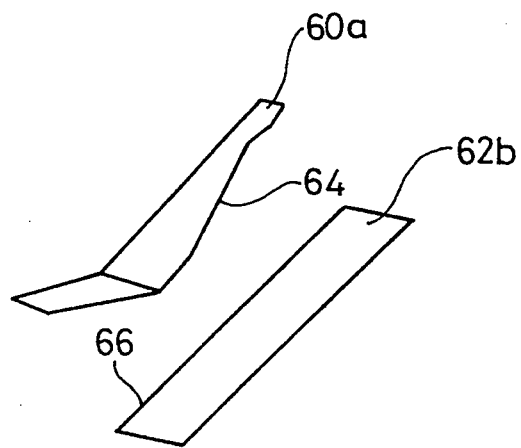
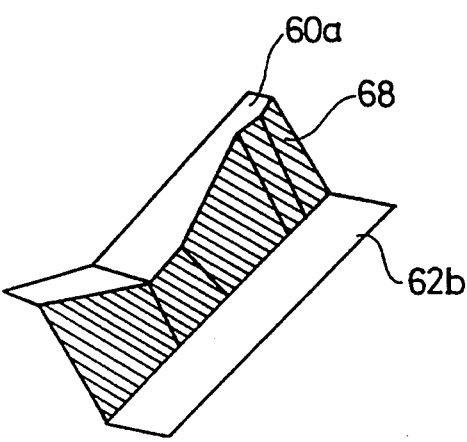

METHOD OF RENDERING A TWO DIMENSIONAL DRAWING INTO A THREE DIMENSIONAL DRAWING, USING A CAD PROGRAM

BACKGROUND OF THE INVENTION

1. Field of the Invention

The present invention relates to a method of creating a solid model with a computer-aided design system (hereinafter called "CAD system").

2. Description of Related Art

When the body of a motor vehicle is designed by using a CAD system, its appearance is defined as an overall model by a set of lines curved along curved surfaces of the body. Thus, when a change is to be made to even just a part of the body, every line segment which passes through the part to be changed has to be reprocessed, thereby adding to the designed time.

On the other hand, when shape data is inputted to the CAD system, it is necessary to provide coordinates of apexes and the relationship of connections among the apexes with a view toward defining a three-dimensional model. Hereinafter, for purposes of simplification of terminology, a 'solid' is considered an entity existing or represented in three dimensions. Accordingly, the concept of rendering a two-dimensional shape into a three-dimensional shape will be described as 'rendering solid' or similar phraseology.

Consider the case where a cross-section taken along line a—a of a front pillar portion of the vehicle shown in FIG. 1a is inputted to the CAD system. In this case, when a glass face 11 of a front is inputted to the CAD system as a reference face, as shown in FIG. 1b, the inclination of a line segment 18 out of input line segments 12 through 18 is rendered positive (+) if its inclination is in a positive direction (clockwise direction) with respect to the reference face. On the other hand, as shown in FIG. 1c, when the above cross-section is seen in a direction opposite to the direction indicated by the arrow of FIG. 1a, i.e., when a cross-section taken along line c—c is inputted to the CAD system, the inclination of the inputted line segment 18 is rendered negative (−) as illustrated in FIG. 1d.

Therefore, there has generally been proposed to make clear the relationship between the direction and the position, for example, a method of using auxiliary lines in the form of matrix, which are indicative of the direction and distance from a reference point, and a method of displaying reference faces common to small parts of a three-dimensional model or the like on the same screen and inputting the relationship between the direction and position with respect to the reference faces or the like so as to create a graphic shape.

However, a practical drawing creation is not always evolved only from drawings projected from a predetermined direction. The turning from the front side to the reverse side of a drawing or vice versa is made or a drawing is created in a state in which it is seen from the reverse side, thereby causing a possibility that the positive and negative signs of the position and angle are reversed, and a false creation of the drawing is made unless the operator is experienced. In addition, such a data inputting method has the problem that much labor is required upon inputting the data and the operator is apt to make errors upon inputting the data.

When it is desired to construct a solid shape as a product on the CAD system, individual graphic shapes are defined as elements. Thereafter, the operator adds the relationship between graphic shapes to the CAD system; shapes which the operator desires to create must also be decomposed into elements and the so-decomposed elements must be defined. In addition, many operations are required to define individual elements. The relationship of correspondence between the graphic shapes is also represented in the form of lines, and the solid shape is not defined as a solid including faces.

On the other hand, when it is desired to create a solid model in the CAD system, the solid model is seen from a plurality of directions indicated by arrows, and respective intersecting points in the plurality of directions and line segments defined along the plurality of directions are determined. They are then connected to each other to create faces. However, when the intersecting points and the line segments are determined, a plurality of line segments (or points) exist in a mixed state, thereby causing difficulty in grasping or recognizing shapes. In addition, since the solid model is held as data about ridgelines, a large number of design steps are required.

SUMMARY OF THE INVENTION

It is a principal object of the present invention to provide a method of creating a solid model, thus reducing the burden on an operator of inputting data, and enabling easy creation of a solid model.

It is another object of the present invention to provide a method of creating a solid model by a CAD system, the method comprising the steps of dividing a final solid model into a plurality of shape portions and forming the same, and connecting the so-divided and formed plurality of shape portions to each other to create a solid model.

It is a further object of the present invention to provide the method wherein the solid model is divided into shape portions whose cross-sections each represented by specifying dimensions of a cross-section of at least one location thereof is uniform.

It is a still further object of the present invention to provide the method wherein the respective shape portions are divided and formed in a state in which they overlap each other.

It is a still further object of the present invention to provide the method wherein the connection of the plurality of shape portions to each other is a complete continuity of individual line segments and represented by a combination of a plurality of respective faces.

It is a still further object of the present invention to provide the method wherein the respective shape portions are represented by shapes inputted as numerical values as seen in different directions indicated by arrows.

It is a still further object of the present invention to provide a method of creating a solid model by a CAD system, the method comprising the steps of setting up a reference line segment, setting up shape points within allowable ranges of the CAD system with respect to the reference line segment, then setting up position data from the reference line segment with respect to specific points of the shape points, and thereafter setting up position data about other shape points provided that the specific points are defined as criteria.

It is a still further object of the present invention to provide a method of creating a solid model by a CAD system, the method comprising the steps of defining outer shapes by inputting shape values of the solid model as a criterion, and creating a solid model represented in a desired shape by connecting, with faces, between at least two line segments projected as seen in the directions indicated by arrows with respect to the solid model whose shape values are inputted.

It is a still further object of the present invention to provide the method wherein the line segments are those each defined at a position where each of the projected two line segments and an original solid model cross each other.

It is a still further object of the present invention to provide the method wherein the line segments are those each defined at a position where two line segments projected as seen in two directions indicated by arrows cross each other.

The above and other objects, features and advantages of the present invention will become apparent from the following description and the appended claims, taken in conjunction with the accompanying drawings in which a preferred embodiment of the present invention is shown by way of illustrative example.

BRIEF DESCRIPTION OF THE DRAWINGS

FIG. 2 is a schematic block diagram depicting a CAD system to which the present invention is applied;

FIG. 3 is a diagram for describing the structure of programs employed in the CAD system;

FIGS. 8a, 8b, 8c, 8d, 8e, 8f, 8g, 8h, 8i, 8j, and 8k are diagrams for describing the editing of blocks each having the shape obtained from the method according to the present invention;

FIG. 13 is a diagram for describing one example of blocks at the portions adjacent to the door opening of the side panel of the vehicle, created according to said one embodiment of the method of the present invention;

FIG. 20 is a diagram for describing the basic functions of the method according to the present invention, the diagram showing the manner in which ridgelines of a plurality of solids are connected to each other by faces;

DETAILED DESCRIPTION OF THE PREFERRED EMBODIMENTS

Figure 1A:
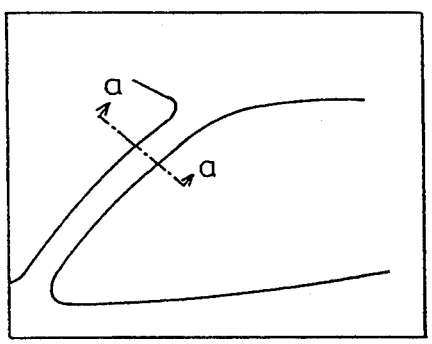
FIGS. 1a, 1b, 1c, and 1d are diagrams showing the manner in which data is inputted to a conventional CAD system.
Figure 1B:
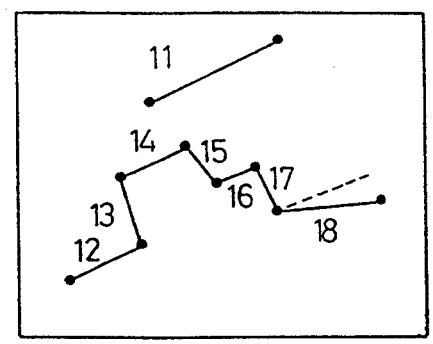
Figure 1C:
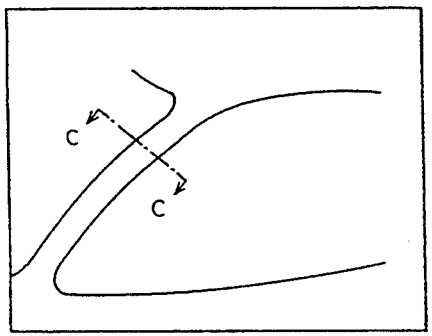
Figure 1D:
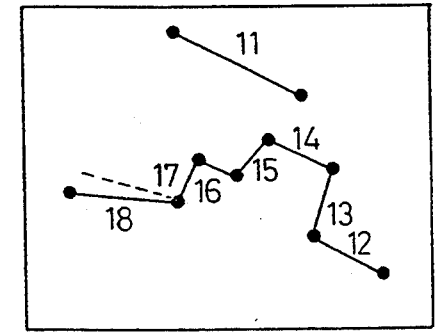

As shown in FIG. 2, a CAD system to which a method of creating a solid model according to one embodiment of the present invention is applied, comprises a computer having a central processing unit and functions of graphic calculation, control of graphic display, supervision of a data base, etc., a mass storage system 4 capable of preserving a large amount of graphic information and updating the same, a plurality of graphic displays 8 each as a centrally-operated device used to display interactive talk between the CAD system and a user who utilizes the same, each display 8 being used to be operable with an input device, a graphic output device 6 such as an XY plotter, a tablet 10 electrically connected to each of the graphic displays 8, a keyboard 12, a mouse 4, a lightpen 16, etc.

The CAD system has a number of programs shown in FIG. 3. The programs can be classified into the following modules or the like according to their functions:

(a) An operating system 32 and a control module 34 each used to perform information processing and control the flow of information in the CAD system.

(b) An input module 44 used to aid in such a manner that an input operation corresponding to each of various types of input devices, for example, the keyboard 12 is smoothly performed.

(c) An input interpretive module 40 used to read or translate input information in accordance with the form of a command.

(d) A display module 38 used to control display information and carry out display processing of the information.

(e) A command module 24 used to execute graphic processing in accordance with commands comprising submodules corresponding to instructions.

(f) A data base operation module 50 used to efficiently retrieve and store a large amount of information held in a data base 54, which is necessary for the CAD system.

(g) A macro module 28 used to execute a macroprogram 26 as an automatic design program.

(h) An external system interface 30 used to perform information exchange and interlocking processing with respect to another CAD system.

In the CAD system, there are also provided auxiliary files such as a system control file 22 used to store therein information about the structure of the system, reference values, etc., a command control file 42 used to store therein information about the operational property of each command and a procedure for the control of programs, a display control file 36 used to store therein information about the type and structure of each display, etc., in order to keep the extendability and maintainability. Incidentally, as an alternative to the above auxiliary files, there are provided a graphic processing library 46 used to perform graphic processing, a display library 48 used to display graphic shapes on one of the graphic displays 8, a drawing issue utility 56 used to issue the result of graphic processing to the graphic output device 6, a data exchange utility 52 used to be connected with other CAD system, etc.

A description will now be made in brief of each module. The control module 34 is used to set a group of programs in the form of a module, unitarily supervise the intrasystem control, and standardize access procedure by intervening between adjacent modules. The control module 34 performs processing for each of a start, completion and malfunction, control for execution of programs by each module, recording of a history of executed programs, a debug function, specific processing with respect to the operating system 32, etc.

The input module 44 provides a user with a suitable input procedure based on a specification made by arranging and unifying various information inputting methods using various input devices. The input module 44 has functions for promotion of input operation for designating the type of information to be inputted, a method of inputting information, and an input device, to the user, selection of one from the input devices and conversion of a present mode used for input formation into a normal mode.

The input interpretive module 40 serves to support diverse information inputting and indicating methods, improve the operability of inputting information, and maintain the extendability of the system by unifying a method of interpreting input information and a method of displaying the result of its interpretation. The input interpretive module 40 has functions for interpretation of the input information and the display of result of its interpretation.

The display module 38 serves to unitarily process the demand for diverse display operations and control both displayed information and display status. In addition, the display module 38 has functions for performing the supervision of each display device, the display control, and the supervision of both the displayed information and display status.

The command module 24 serves to unitarily supervise the form of an input argument, access to a processing program based on a command and a method of processing the result of its access, thereby keeping the maintainability and extendability.

The data base operation module 50 serves to standardize a method for the operation of a data base required by other modules, and provide a means for recovering the data base at the time of occurrence of faults. In addition, the data base operation module 50 has functions for supervising the status of use of the data base 54, the operation of the data base 54, the processing for recovery of the data base at time of occurrence of the faults, etc.

The external system interface 30 standardizes the transfer of information with other systems. In addition, the external system interface 30 performs the transfer of the information between an external system and the interface 30 and control for the execution of external programs.

The macromodule 28 performs the control for the operation of the CAD system in accordance with a created macroprogram 26, and has functions for carrying out the translation of the macroprogram 26 and executing the macroprogram 26.

A description will now be made of the shapes employed in the method of creating the solid model using the CAD system constructed as described above. Each of shapes to be created hereinafter will now be referred to as "a block". Patterns for defining the blocks are classified as follows:

(1) A section block for creating a solid having a substantially uniform cross-section.

(2) A view block for creating a solid as seen in a certain direction.

(3) A connection block for creating a shape used to connect among solid models which have already been defined.

(4) A knob block used to create a patterned subsidiary shape and to be connected to a previously defined solid.

Figure 4B:
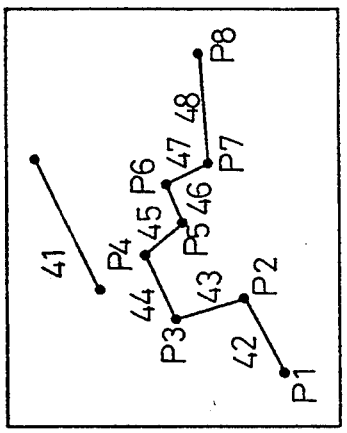
FIGS. 4a, 4b, 4c, and 4d are diagrams for describing a method of inputting shape data for a section block.
Figure 4D:
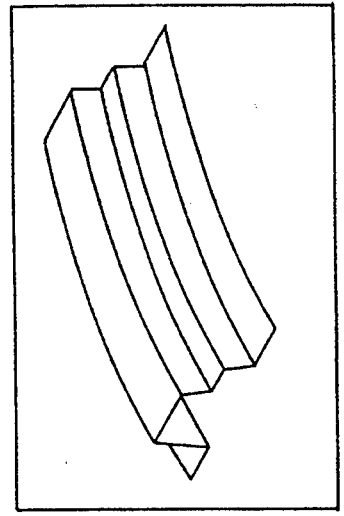
Figure 4A:
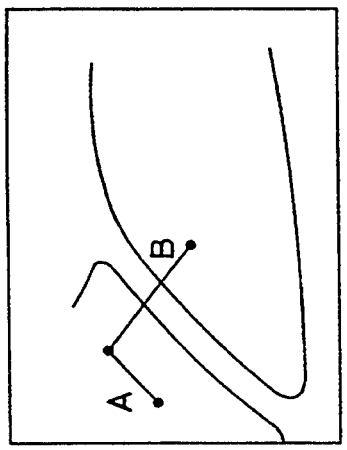

A description will first be made of a case where sectional shapes of front pillar portions of a motor vehicle shown in FIG. 4a are created as one example of "section block".

The direction of a cross-section and its location are indicated by line segments A and B, respectively, as shown in FIG. 4a, and the mating face of a glass as a reference is indicated by a reference line segment 41 as shown in FIG. 4b. Thereafter, a cross-sectional shape of the front pillar portions is indicated by line segments 42 through 48 in a rough manner.

The procedure for inputting such cross-sectional shapes to the CAD system is carried out by using input-/output devices as shown in FIG. 2. With reference to FIG. 4b, the inputting can be accomplished by moving a cursor onto each of approximate positions P1 to P7 corresponding to both ends of respective line segments arranged in order from 42 through 47, and depressing keys so as to input the sectional shapes as information to the CAD system. In this case, it is unnecessary to accurately set each of the line segments 42 through 47 horizontally and vertically with respect to the reference line segment 42. It is therefore sufficient to set approximately correct shapes.

Then, when it is desired to input the inclined line segment 48 as information to the CAD system, the cursor is moved to the position P7 and a position P8 corresponding to both ends of the line segment 48, and desired keys are depressed. Even in this case, it is unnecessary to accurately input information about the inclination of the line segment 48. Its information may roughly be inputted with such degree that it is possible to determine that the line segment 48 is inclined. Incidentally, specific numbers such as positions P1, P2, etc. are assigned to inputted line segments, points, etc.

When data is inputted to the CAD system in this way, a schematic shape is displayed on a CRT as shown in FIG. 4b.

Figure 4C:
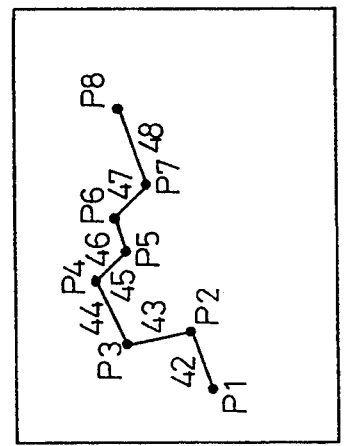

Then, the distance between one end of the reference line segment 41 and each of the positions P1 to P8, and the angle formed between reference line segment 1 and each of line segments 42 to 48, are inputted as data. Based on such inputted data, the CAD system corrects the rough shape of FIG. 4b to produce the accurate shape of FIG. 4c. The above process for inputting a cross-section, is repeated for several cross-sections of the section block, and then the CAD system interpolates such cross-sections to produce the solid shape shown in FIG. 4d. As a result, the operator can grasp or recognize the shape as a solid graphic shape.

When it is desired to input dimension data of the line segment 48, for example, the operator of the CAD system does not need to consider in which direction the line segment 48 is inclined with respect to the reference line segment 41. Namely, the direction in which the line segment 48 is inclined was already roughly set when the inclined line segment 48 as data was roughly inputted, as shown in FIG. 4b. As a consequence, the data input work can be performed extremely easily and accurately.

Figure 5A:
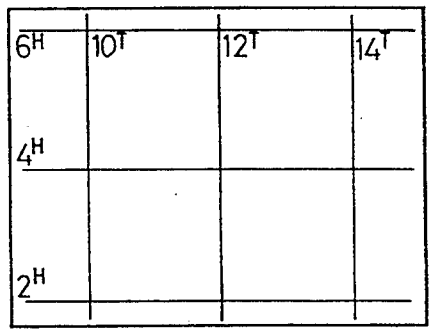
FIGS. 5a, 5b, 5c, and 5d are diagrams for describing a method of inputting two-dimensional shape data for a view block.
Figure 5B:
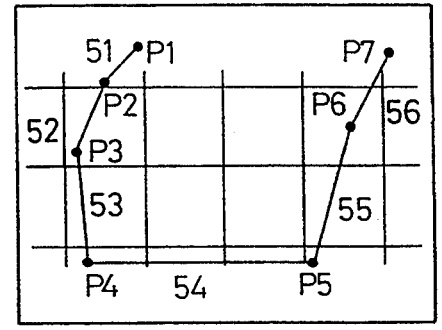
Figure 5C:
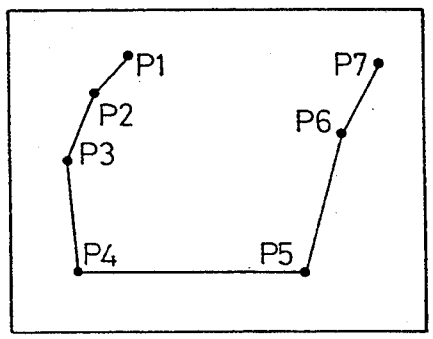
Figure 5D:
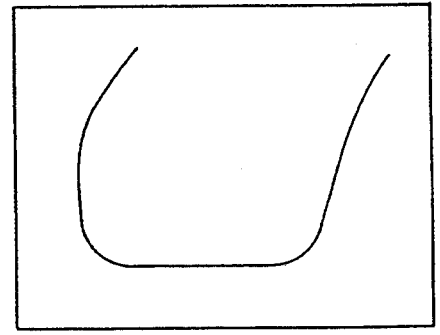

A description will now be made of a method of inputting a two-dimensional shape as one example of "view block". FIG. 5a shows a screen on which numbered lines are displayed, and a rough shape seen from one direction, is inputted as data on such screen, by using line segments 51 to 56, as seen in FIG. 5b. Then, data about each of the positions P1 to P7 is inputted to the screen and thereafter the inputted data is processed by the CAD system. As a result, the two-dimensional shape shown in FIG. 5c can be obtained. Thereafter, data is inputted about the radius of each of the positions P1 to P7, followed by circular-arc processing, to obtain an accurate shape illustrated in FIG. 5d.

Since it is unnecessary to designate the direction of a circular arc at the time of the above-mentioned circular-arc processing, shape data can be produced extremely easily in the same manner as the case of the section block.

Rough shapes as seen from other directions are inputted as data in the same manner as described above, thereby obtaining accurate shapes. Then, the so-obtained shapes are interpolated to create a solid shape of the view block.

A description will now be made of "connection block", "knob block", "block operation", and "block editing".

Connection block

Figure 6A:
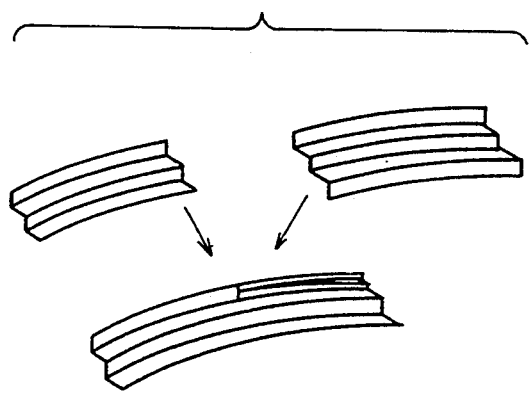
FIGS. 6a, 6b, 6c, and 6d are diagrams for describing connection blocks each having the shape obtained from a method according to the present invention.

As shown in FIG. 6, connection blocks are employed in the working for joining partial shapes. The connection blocks have a function for directly connecting between solid shapes or connecting with a new solid being defined therebetween. The function of each of the connection blocks comprises some commands as will be described as follows:

(a) Band connector (FIG. 6a)

A function for smoothly connecting among a plurality of band-like faces.

Figure 6B:
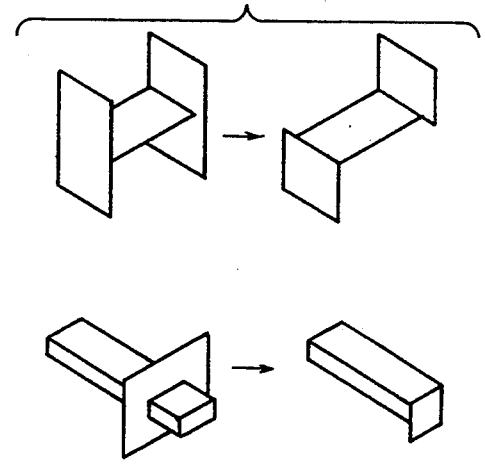

(b) Direct connector (FIG. 6b)

Excess or unnecessary portions are cut with lines of a plurality of faces, which cross each other.

Figure 6C:
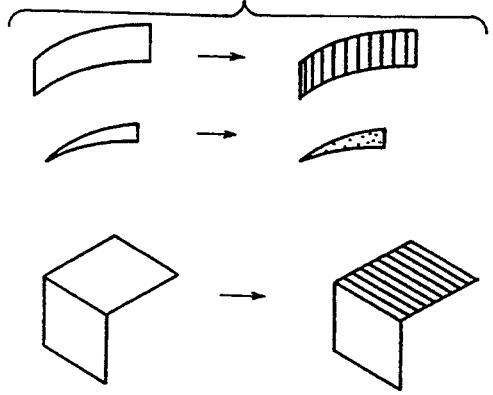

(c) Cave-filling connector (FIG. 6c)

Ruled faces and blended faces are formed among a plurality of line segments.

Figure 6D:
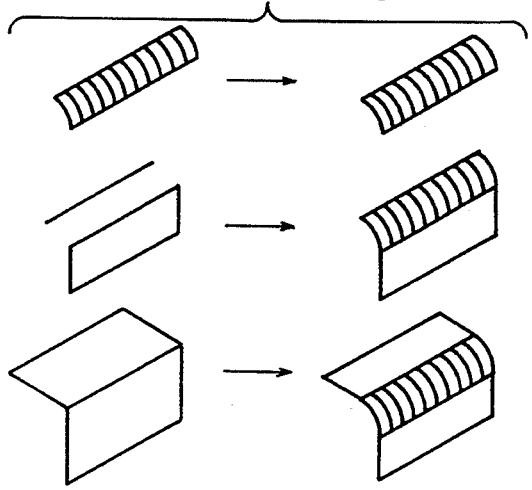

(d) Fillet connector (FIG. 6d)

Fillet faces are extended between line segments, between line segments and faces, and between faces, and at the same time unnecessary edges are cut.

Knob block

Figure 7A:
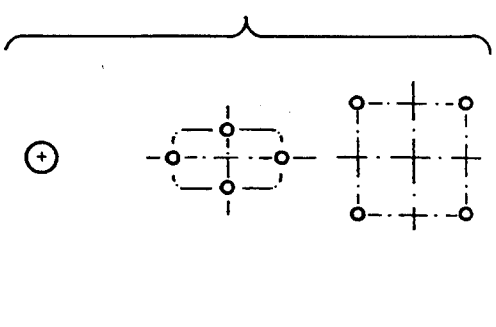
FIGS. 7a, 7b, 7c, and 7d are diagrams for describing knob blocks each having the shape obtained from the method according to one example of the present invention.

The knob block has a function for defining shapes constructed appendant to a reference shape, such as a section block, connection block or view block, as shown in FIG. 7. Specifically, there is provided a function for creating the shapes of holes, seats, joggles, and beads. The function comprises the following commands:

(a) Hole (FIG. 7a)

The center and contour of each hole are defined.

Figure 7B:
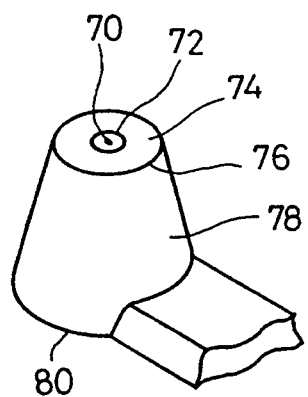

(b) Seat (FIG. 7b)

The knob shape is rendered solid by using parameters such as the center 70, end 76, hole 72, slope 78, face 74 and base 80.

Figure 7C:
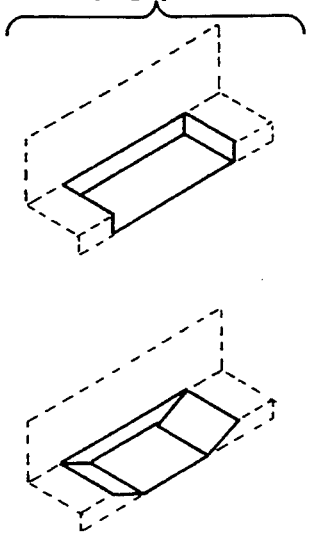

(c) Joggle (FIG. 7c)

The shape of a joggle is created as a solid. Faces for providing joggles must be defined as the condition for defining the joggles.

Figure 7D:
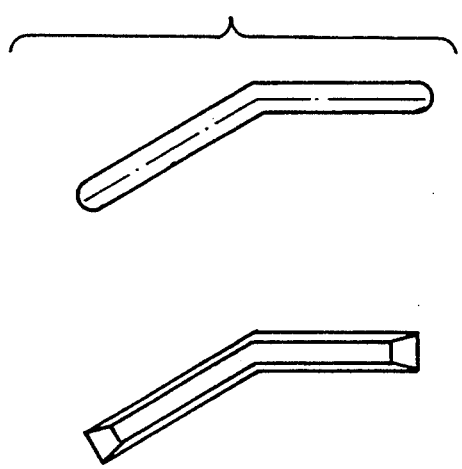

(d) Bead (FIG. 7d)

A bead shape is created. However, the bead shape is represented as a set of each line at the intersection of each face of the bead with its associated faces, the center line of the bead, and ridgelines within the bead. For further processing of the above-described blocks, block operations and block editing will be described.

Block operation

The block operation is performed to create shapes or the like, which are obtained by copying the already-defined shape or converting the same.

(a) Copy

Graphic shapes are duplicated into a set (block) of other shapes and then merged.

(b) Conversion

The graphic shapes are copied, and thereafter the copied graphic shapes are subjected to a coordinate conversion such as parallel translation, revolution, enlargement, reduction, symmetric translation, etc.

(c) Conversion of board thickness

The shape defined as the solid is subjected to board thickness conversion, thereby automatically creating the converted shape.

(d) Direction of board thickness and value thereof

The setting and change in the direction of thickness of a solid board and the value thereof are performed.

Block editing

The block editing programs comprise command groups having editing functions such as a combination of faces and solids, division of the faces and solids, etc. as shown in FIGS. 8a through 8k.

(a) Division (FIG. 8a)

The division of each of the faces and solids is carried out by cutting a plurality of line segments and faces and separating them from each other.

(b) Cutting off (FIG. 8b)

The cutting of each of the faces and solids is performed by cutting a plurality of line segments and faces and eliminating unnecessary portions therefrom.

(c) Extension (FIG. 8c)

The extension of each of the faces and solids is carried out by extending faces and line segments.

(d) Face partitioning (FIG. 8d)

A single face is divided as desired with line segments on a face whose one end corresponds to a boundary line and whose other end falls therewithin. (e) Integration of composite faces (FIG. 8e)

A plurality of connected faces are combined into a composite face so as to be handled as a single face.

(f) Integration of shape faces (FIG. 8f)

A plurality of adjacent solids are smoothly formed into a single solid. Thus, there is no boundaries between adjacent solids.

(g) Apex alignment (FIG. 8g)

The displacement of an apex (a point where a plurality of line segments intersect) within a solid model is corrected, thereby eliminating space between adjacent line segments with respect to the apex. The apex alignment is used in execution of the board thickness conversion, for example.

(h) Definition of shape face (FIG. 8h)

A face enclosed with a plurality of line segments on the same plane is defined so as to be treated as a solid.

(i) Block patching (FIG. 8i)

Two solid models, which exist in different blocks, are connected to each other into a single solid model. In addition, unnecessary portions are eliminated.

(j) Knob patching (FIG. 8j)

Solids are connected to each other in a state in which they are detachable later, separately from the solids produced by the knob blocks.

(k) Separation of knobs (FIG. 8k)

A knob shape of a solid which is connected as a knob is eliminated so as to return to the reference shape.

A description will now be made of a case where the solid model creating method according to the present invention is applied to one example in which the portions adjacent to the door opening of the side panel of the vehicle are divided.

First, data about the portions of the side panel adjacent to the door opening (such as dimensions, curvature and the like), are plotted on the CRT based on a conventional two dimensional product drawing. Then, portions whose cross-sections can be considered as being uniform are divided (as indicated by symbols K, L, M, N and P in FIG. 9).

Figure 9:
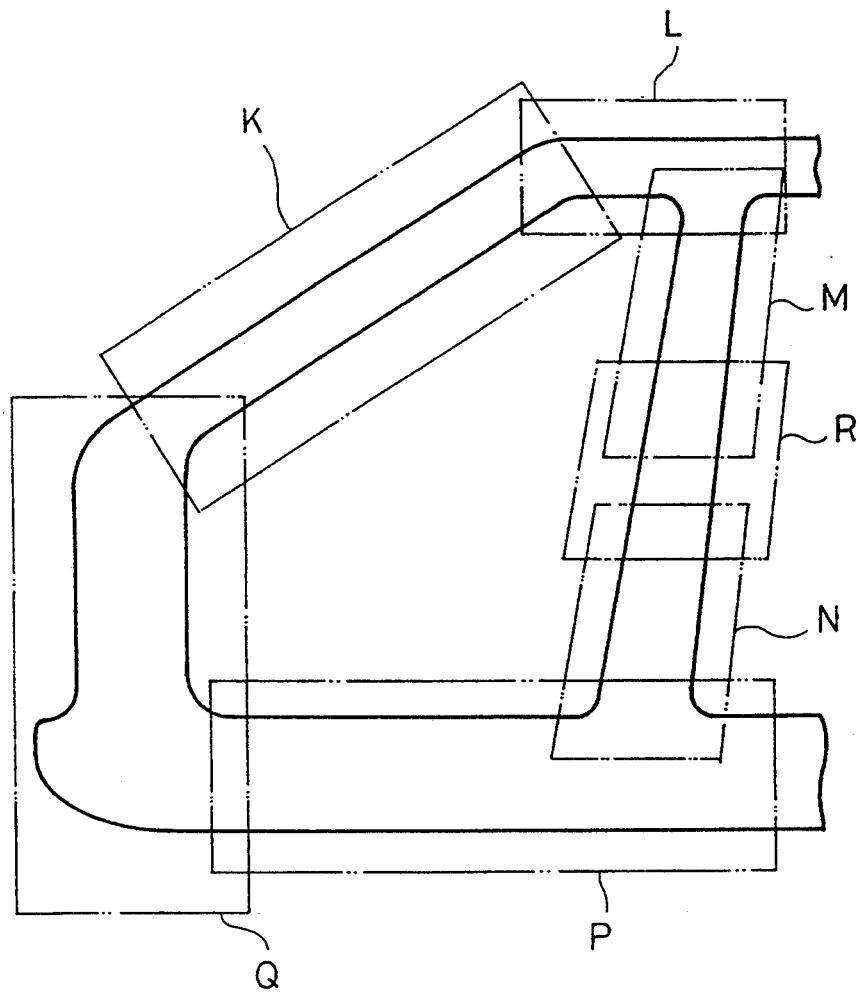
FIG. 9 is a diagram for describing the division of portions adjacent to a door opening of a side panel of a motor vehicle according to one embodiment of the method of the present invention.

Then, the remainder is divided as view portions (portions indicated by symbols R and Q in FIG. 9). The above process for making portions solid, is performed on the view portions.

Figure 10:
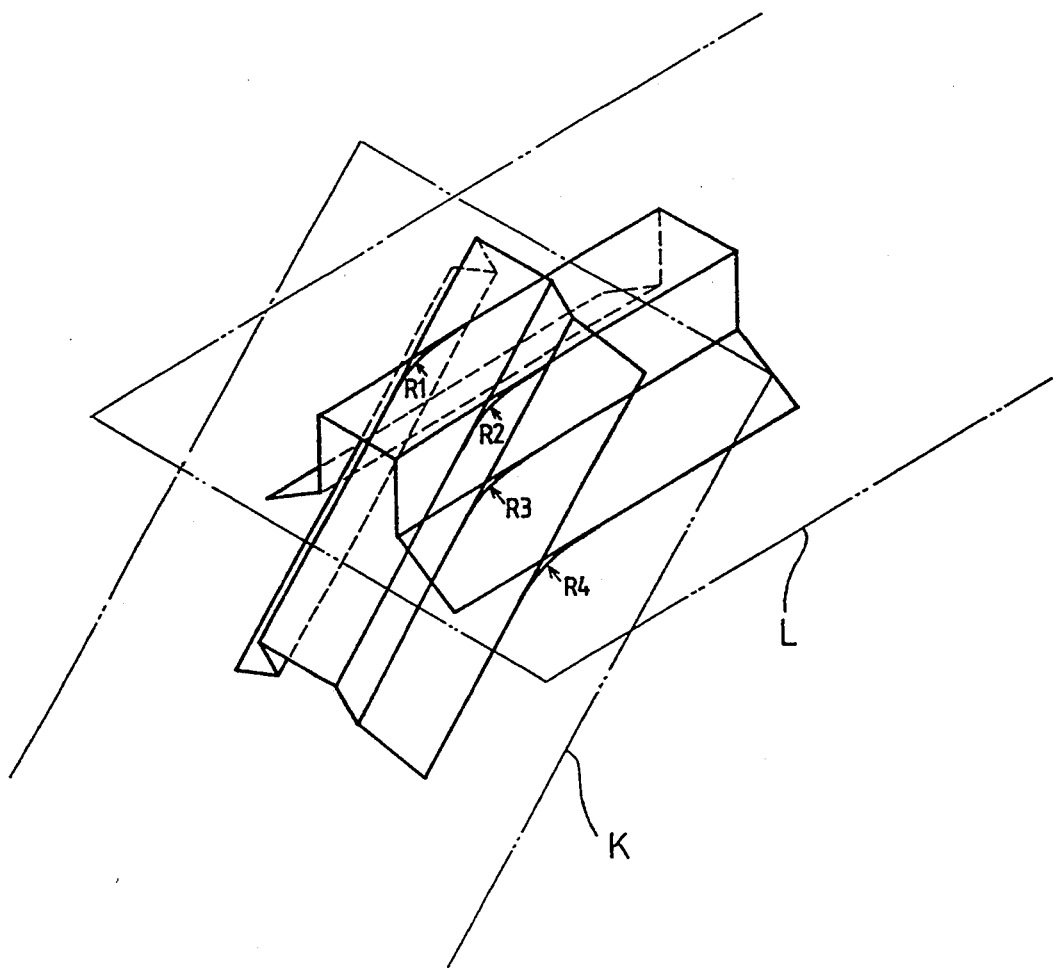
FIG. 10 is a diagram showing the manner in which the divided portions are connected to each other.

When it is desired to make the portion K solid in FIG. 9 by way of example, the shape of the portion K is roughly inputted as data as described above with reference to FIG. 4, and the respective dimensions of the portion K are inputted as data, thereby determining the shape accurately. Likewise, portion L is rendered solid. Thereafter, portion L and portion K are extended so as to cross each other as shown in FIG. 10. Then, for example, the radius and center of the portion thus crossed is suitably determined, and processing for connecting the portion L and the portion K is carried out by circular arcs (of respective radii R1, R2, R3 and R4, as shown in FIG. 10) After completion of the connection processing between the portions L and K, unnecessary portions are removed. The connection processing between the portions Q and K is performed in the same manner as described above.

Figure 11:
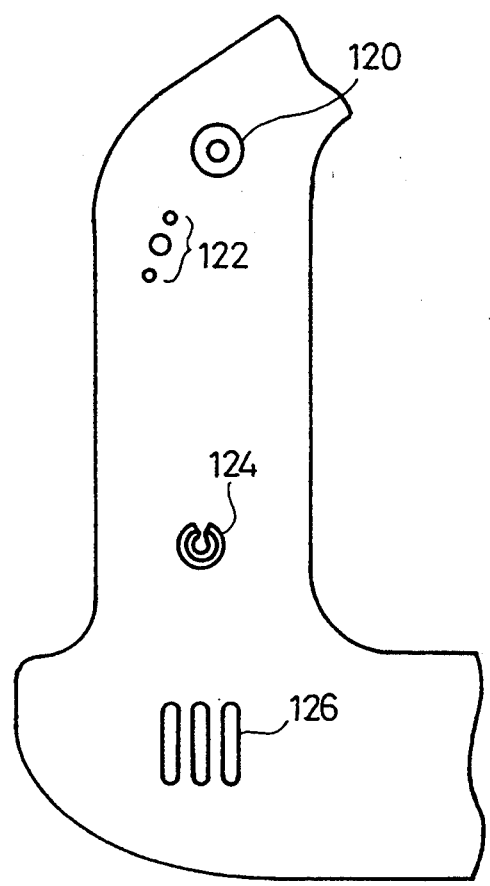
FIG. 11 is a diagram depicting a part of the portions adjacent to the door opening of the side panel of the vehicle.

Regarding the portion Q, a seat 120, holes 122, a bump 124, and beads 126 are rendered solid as illustrated in FIG. 11. Shapes 120 and 124 are rendered as a knob block or a hole, as appropriate. As mentioned above with reference to FIG. 7a, the holes are determined by defining the center of each of the holes and profile lines of the holes. Further, the beads are as described above with reference to FIG. 7d.

Figure 12:
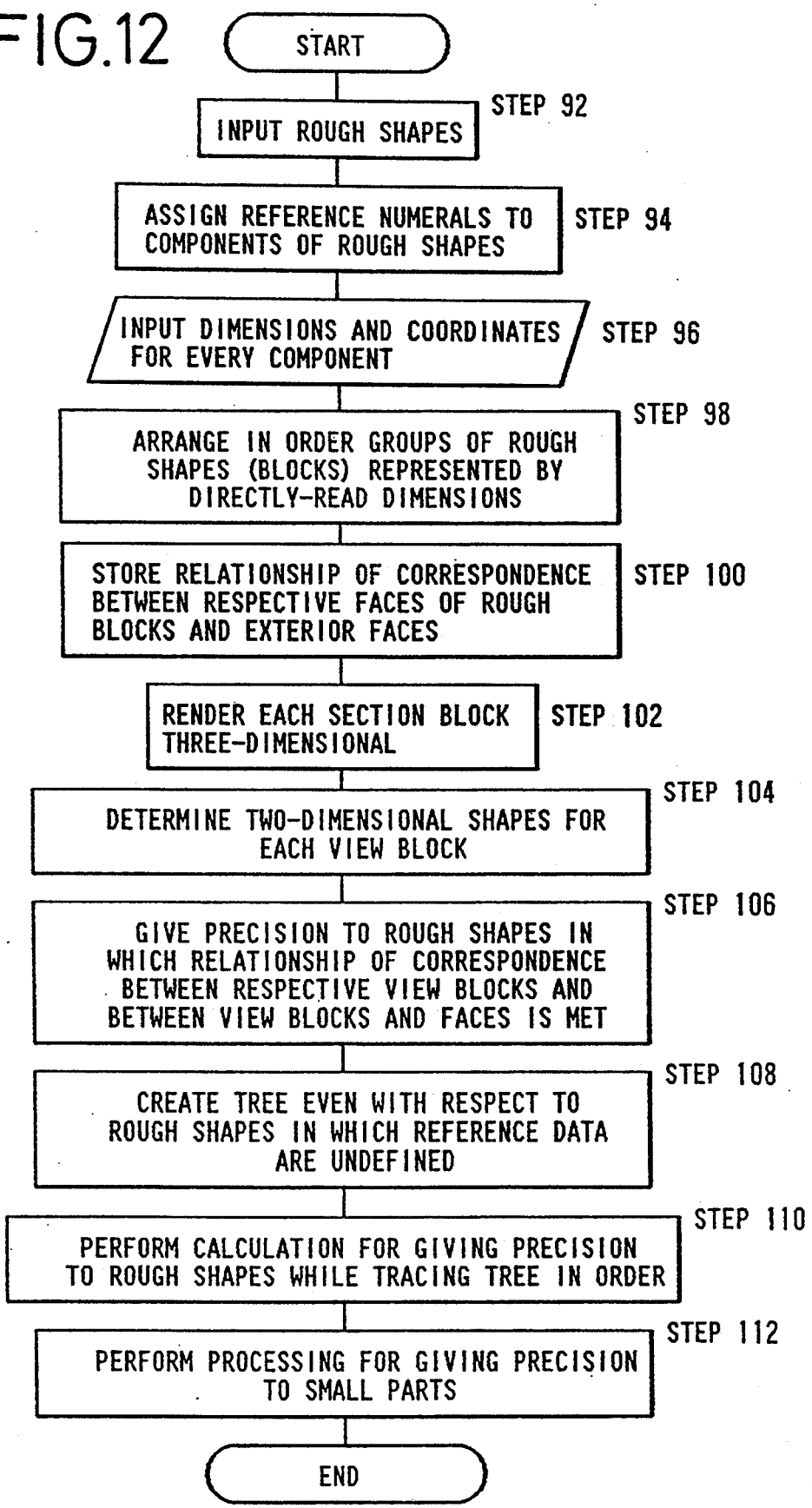
FIG. 12 is a flowchart for describing the routine procedure for making more precise the rough shape according to the present invention.

FIG. 12 is a flowchart for the procedure mentioned above, and will be explained next.

First a rough shape is inputted in Step 92. Then, reference numerals or other identifying means are assigned to components of the inputted rough shapes, respectively in Step 94, and the dimensions of the rough shapes and coordinate values thereof are inputted for every component of the rough shapes in Step 96. Then, the groups of the rough shapes (blocks) represented by the directly-read dimensions are arranged in order (of outline drawings, section blocks, view blocks and small parts) in Step 98. Then, information about the relationship of correspondence between respective faces of the rough shapes and exterior faces thereof is stored in the data base 54 in Step 100. For each section block, cross-sections are determined and then interpolated, thereby rendering the result three-dimensional in Step 102. In this case, the line segments of the rough shapes are replaced by three dimensional surface data. The faces of the rough shapes each have only face-creating information (straight lines, directions of circular arcs, and radius). Then, two-dimensional shapes associated with the rough shapes are determined for each view block in Step 104. Two-dimensional data about the line segments of the two-dimensional shapes thus determined are stored in the data base 54, and face-creating information about the faces of the shapes is stored in the data base 54. Further, precision is given to the rough shapes in which the relationship between respective view blocks and between view blocks and faces meets a predetermined level of correspondence, in Step 106. A tree is created even with respect to those in which reference data is define and those in which the reference data are undefined in Step 108. Then, the calculation for giving precision to them is performed while tracing branches of the tree in order in Step 110. The process for rendering the above more precise is carried out by solving a system of simultaneous equation. Then, the process for giving precision to the small parts is performed in Step 112. And then, the process is finished.

As described above, there is used with four kinds of blocks (comprising the section block, view block, connection block and knob block), are used and one possible result is shown in FIG. 13. Each door frame mounted on a motor vehicle is divided into several to several tens of small parts. Names or numbers or other identification, for supervision are given to the respective small parts so as to be supervised as a single three-dimensional solid data. When a partial change of design is imposed on a part at the time that the supervision is made in the above-described manner, it is only necessary to correct or modify data about a small portion corresponding to a place to be partly changed. It is therefore possible to facilitate the correction of its data and to make it easier to supervise the data, as compared with the supervision of the line-segment unit.

Data about batch sentences at the time that a novel shape is defined are stored in a history file unless they are omitted in particular. Since the history of the batch sentences is stored in the form of a work block unit, the batch sentences can immediately be retrieved from the history if a worked block is made known. Thus, when it is desired to perform a change of design for modifying only parameters such as values of dimensions of the shapes, etc. in accordance with the same working procedure, the modification and reexecution of the history may simply be carried out. Further, if the portions subjected to the change of design are defined as solid shapes, the cutting and connection of a solid shape with respect to the original shape can collectively be processed.

A description will now be made of another embodiment showing a method of creating a solid model using the CAD system mentioned above.

Figure 14:
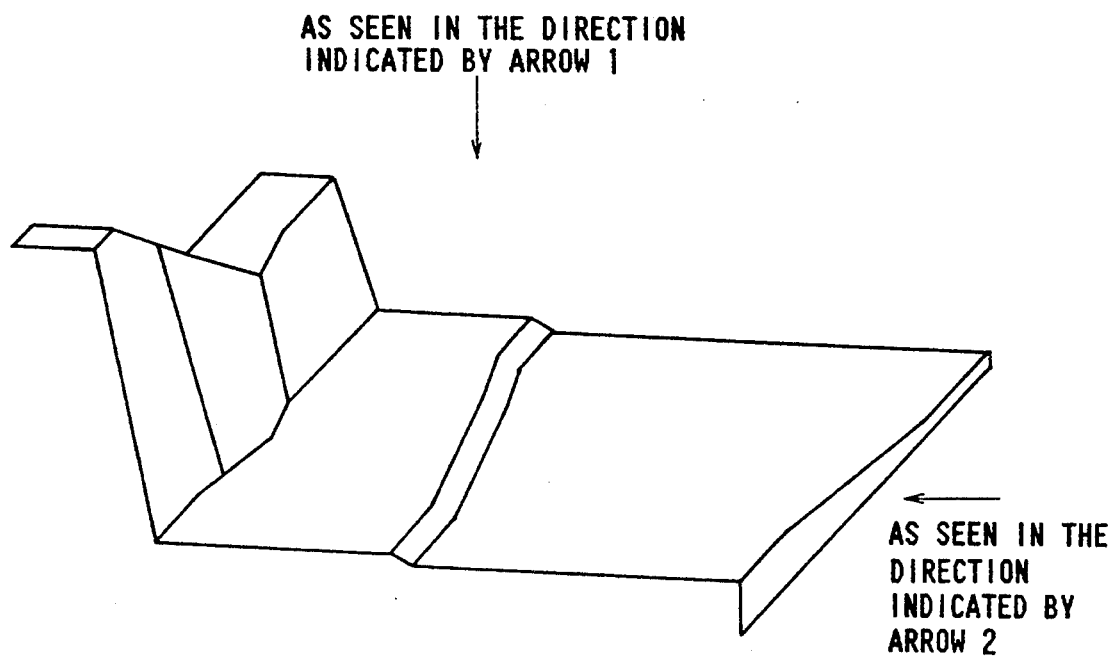
FIG. 14 is a perspective view of a solid shape to which the method of another embodiment according to the present invention is applied.
Figure 15A:
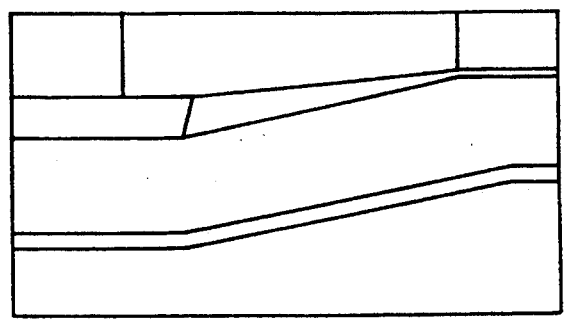
FIGS. 15a and 15b are a plan view and a side view as seen in the directions indicated by arrows in FIG. 14.
Figure 15B:
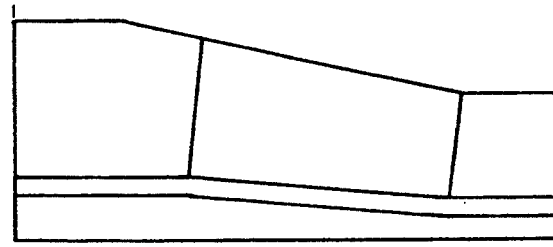

When it is desired to define the shape of a solid model in the CAD system, there is provided a method to determine a plan view (as seen in the direction of an arrow 1) and a side view (as seen in the direction of an arrow 2) as seen in FIG. 15, from the perspective view of the solid model shown in FIG. 14, combining respective dimensions of the solid model represented by the drawings thus determined, and thereby performing definition work of the shape. Incidentally, the data processing about the shape of the solid model in this case is already known and its description will therefore be omitted.

A description will now be made of shape-face processing to facilitate the understanding of the present embodiment.

First, the procedure for creating a shape shown in FIG. 16 will be described.

Figure 17:
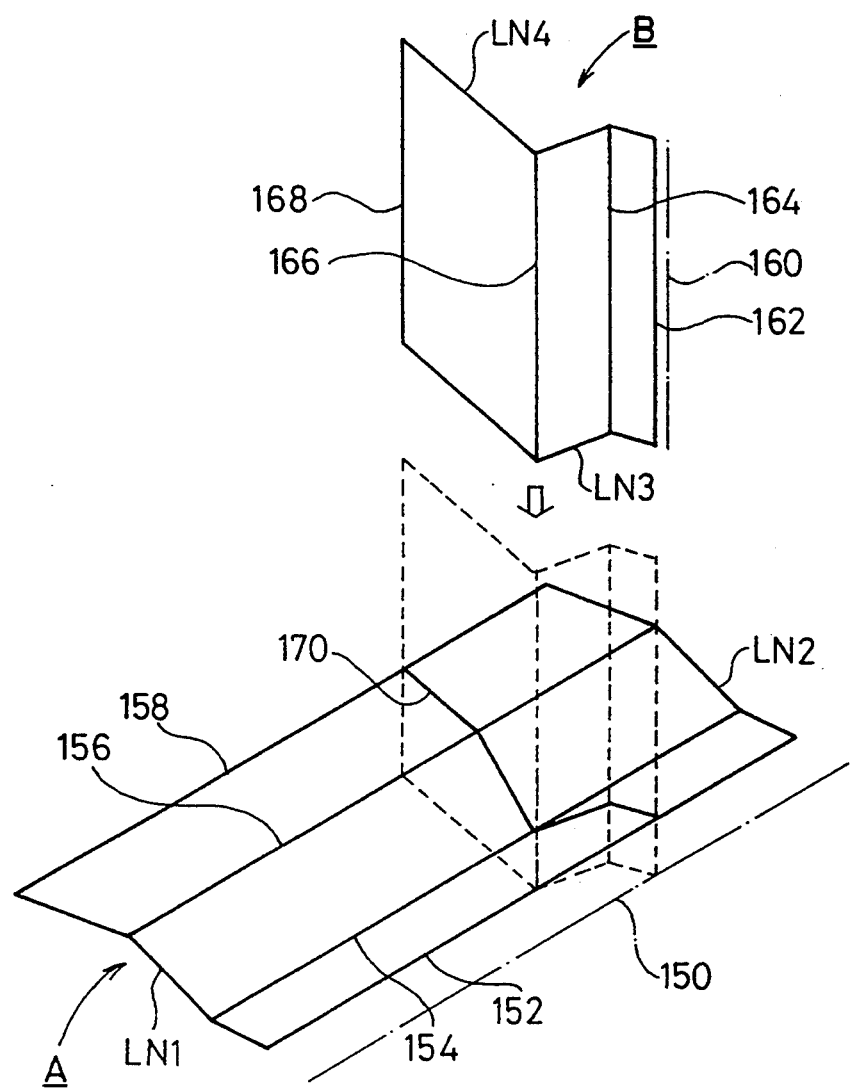
FIG. 17 is a diagram for describing the manner of connection of the two solid models to each other.

As shown in FIG. 17, line segments 152, 154, 156, 158 defined by predetermined dimensions from a reference line segment 150, are created. Then, cross-section line segments LN1, LN2 are produced along the reference line segment 150. They define a solid model A comprising shape-face groups. Similarly, line segments 162, 164, 166, 168 defined by predetermined dimensions from a reference line segment 160, are created. Then, cross-section line segments LN3, LN4 are produced along the reference line segment 160. Such line segments define solid model B comprising shape face groups.

Then, a line segment 170 at which the solid model A and the solid model B cross each other is determined. Various methods are considered to determine the line segment 170. For example, the solid models A and B are subdivided respectively to thereby determine coordinates for the so-subdivided models. If there exist data about both of the solid models A and B in a portion indicative of the coordinates thus determined, it is understood that the portion correspond to line segment 170.

Figure 18:
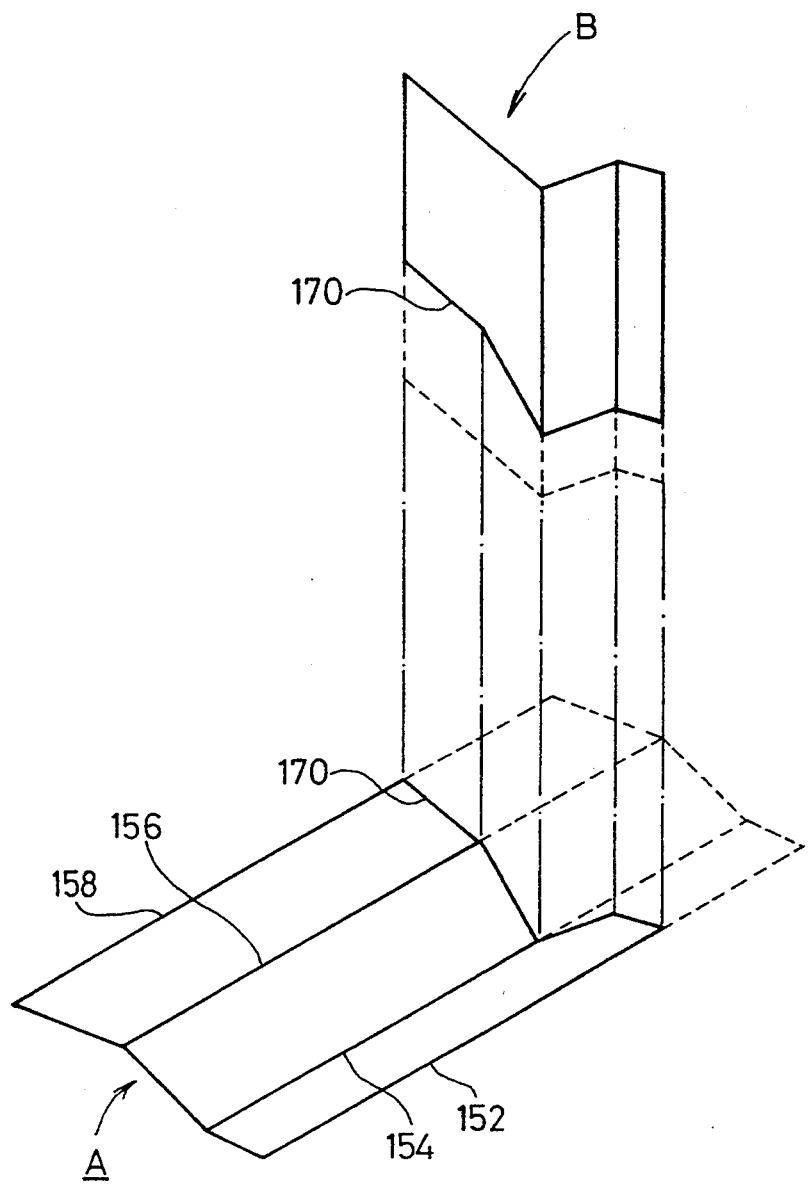
FIG. 18 is a diagram for describing the elimination of unnecessary portions from the two solid models.

After determination of the above crossover line segment 170, processing for eliminating unnecessary portions (indicated by the broken lines) from both solid models A and B is performed as shown in FIG. 18.

Figure 16:
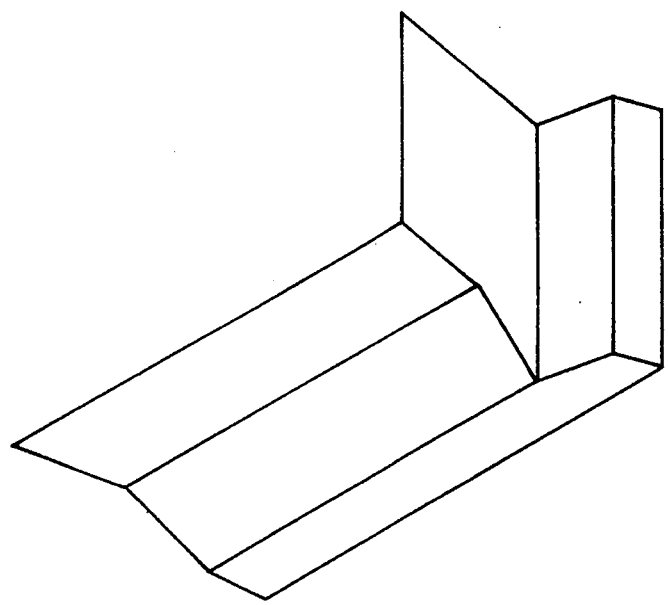
FIG. 16 is a diagram showing two solid models connected to each other.

By finally carrying out processing for connecting the obtained solid models A and B to each other, a desired shape shown in FIG. 16 is created.

Processing of line segments, which are projected on the solid models A and B illustrated in an embodiment to be described later, corresponds to determination of line segments at which faces passing through line segments of each of the solid models A and B cross each other. Therefore, an approach for determining the crossover line segments between both the above solid models A and B can be applied.

The embodiment referred to above will hereinafter be described.

The present embodiment utilizes a method of directly cutting a solid shape or heaping the same as well as a method of using wire frames (ridgelines), upon synthesizing respective shapes as seen in the directions indicated by the arrows. A description will now be made of a method of processing basic graphic shapes with reference to FIGS. 19 through 21.

Figure 19:
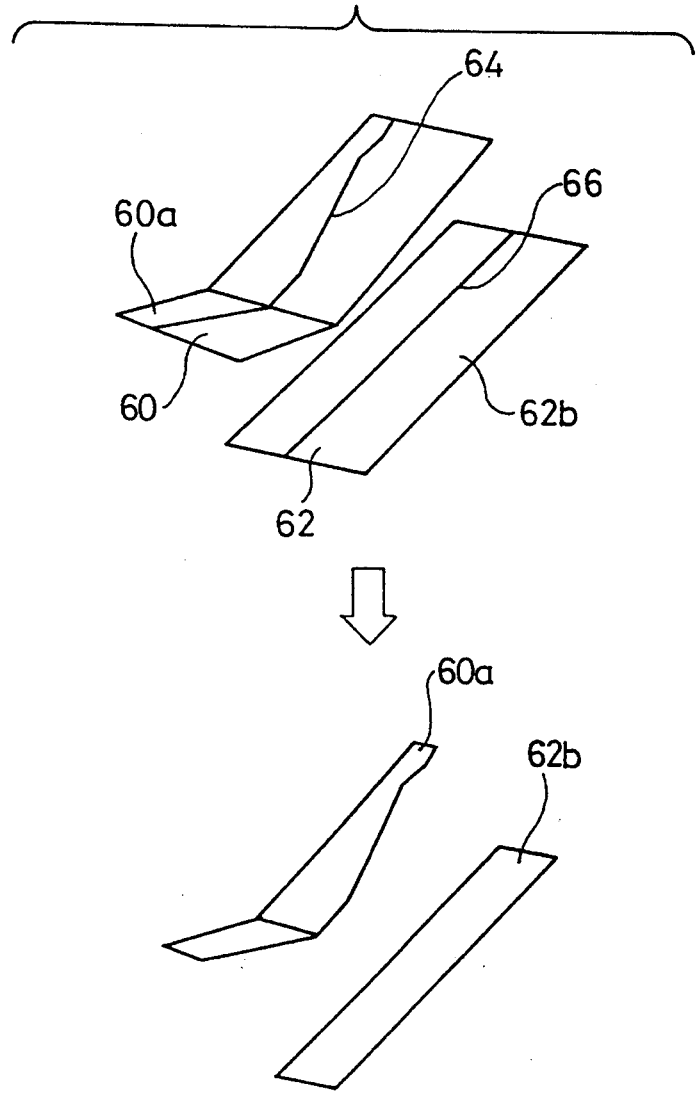
FIG. 19 is a diagram for illustrating basic functions of the method according to the present invention, the diagram showing the manner in which a plurality of solids are cut with line segments.

Two solids 60, 62, which exist in a specific positional relation as shown in FIG. 19, are cut along the lines 64, 66 (which may be straight or curved lines) thereby leaving solids 60a and 62b (each such cutting operation hereinafter called "function 1"). In this case, the lines 64 and 66 can be designated by locating the same below the solids 60, 62 and projecting them on the solids 60, 62.

Then, a face 68 connects the lines 64 and 66 as shown in FIG. 20 (this will hereinafter be called "function 2").

Figure 21:
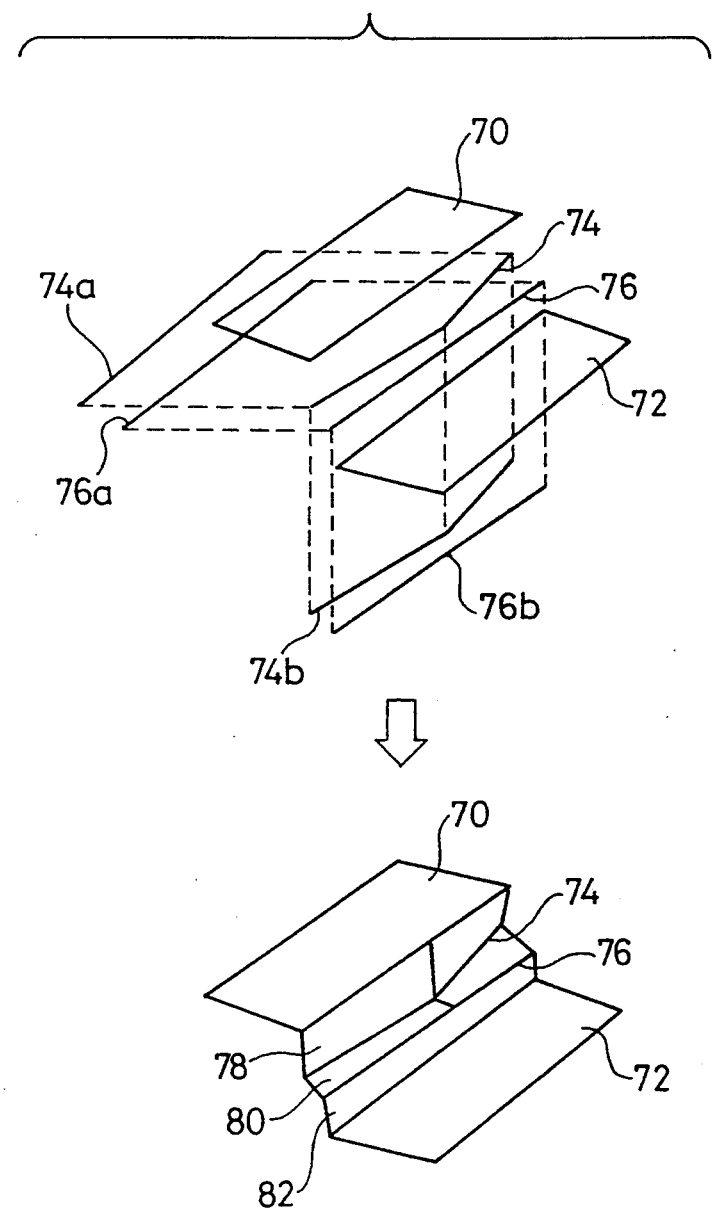
FIG. 21 is a diagram for describing the basic functions of the method according to the present invention, the diagram showing the manner in which the interconnection among a plurality of solids is performed by a plurality of faces.

FIG. 21 shows one example in which line segments 74, 76 are located between two solids 70 and 72 which are present in a specific positional relation, and the solids 70 and 72 are connected to each other using the lines segments 74, 76. For example, line segments 74a and 74b are defined between the solids 70 and 72 and then combined, thereby determining the line segment 74 as a composite line segment. In addition, line segments 76a and 76b are defined between the two solids 70 and 72 and then combined, thereby determining the line segment 76 as a composite line segment. Thereafter, faces 78, 80, 82 automatically connect between the line segments 74 and 76 and between the solids 70 and 72 (this will hereinafter be called "function 3").

A description will now be made of one example in which a specific solid shape is created by making use of the above-described methods, with reference to FIGS. 22 through 29.

Figure 22:
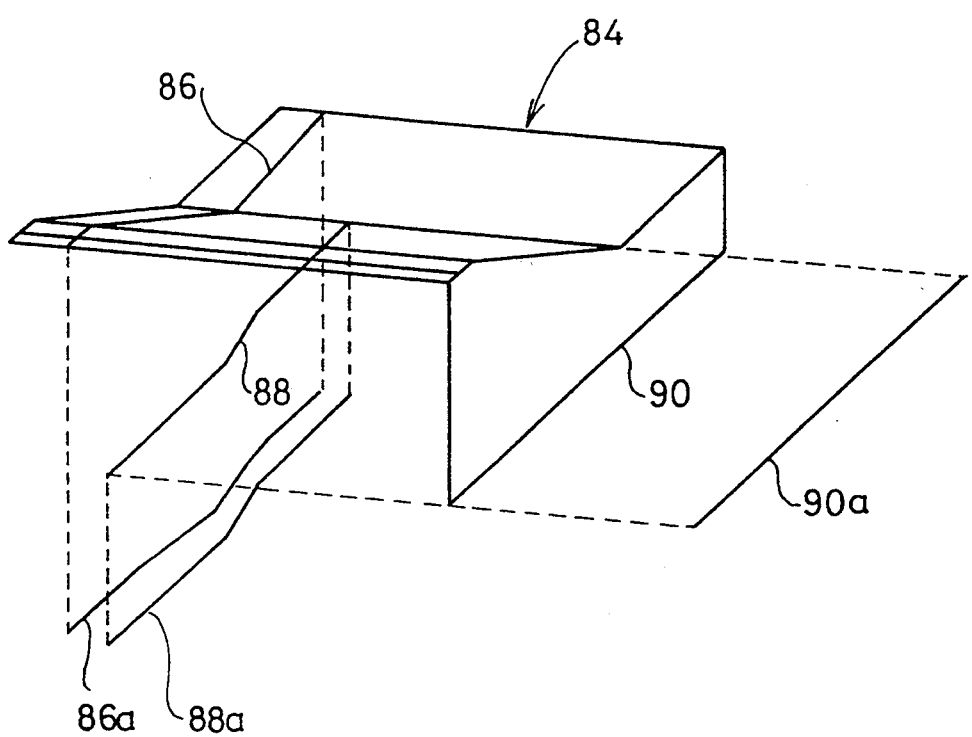
FIG. 22 is a diagram for describing said one embodiment of the method according to the present invention, the diagram showing the manner in which a solid shape is modified by using the basic functions.
Figure 23:
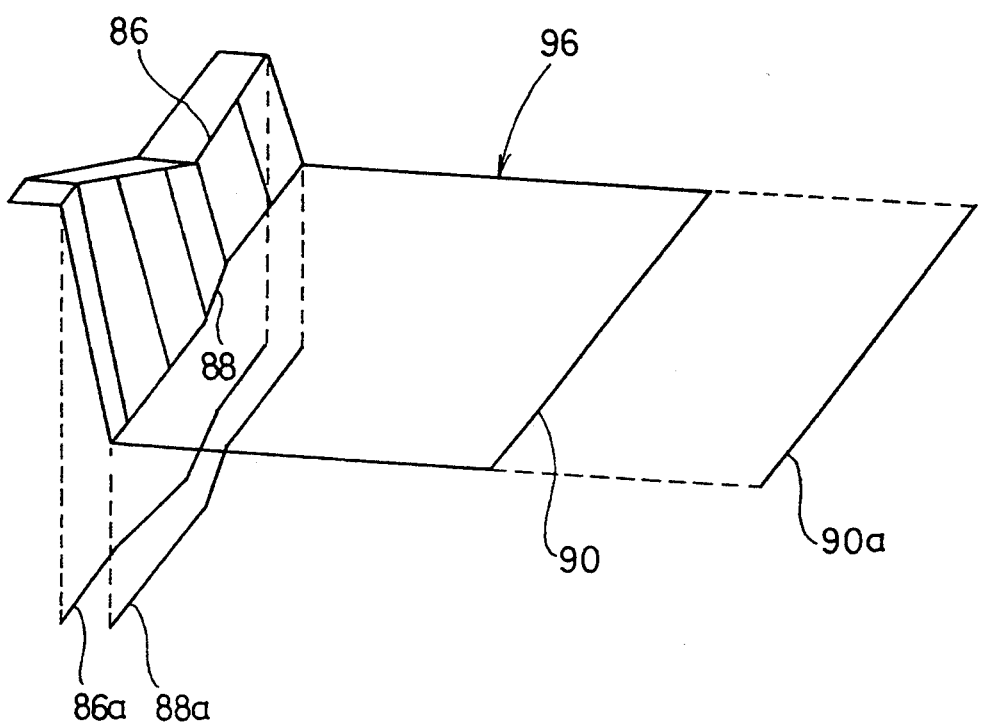
FIG. 23 is a diagram showing the manner in which the modification of the solid shape in FIG. 22 is completed.

Referring now to FIG. 22, line segments 86a, 88a, 90a are positioned in prescribed locations, respectively, with respect to a solid shape 84. In this case, the function 1 is applied to the line segment 86 and solid shape 84, and the portion of the solid shape 84 on the right side thereof is cut. The line segments 88a and 90a are combined to thereby determine the line segment 88 as a composite line segment. In addition, a face formed between the line segments 86 and 88 by the application of function 2, as seen in FIG. 23; a face is formed between line segments 88 and 90. As a result, the solid shape 84 is represented-in the form of a solid shape 96 shown in FIG. 23.

Figure 24:
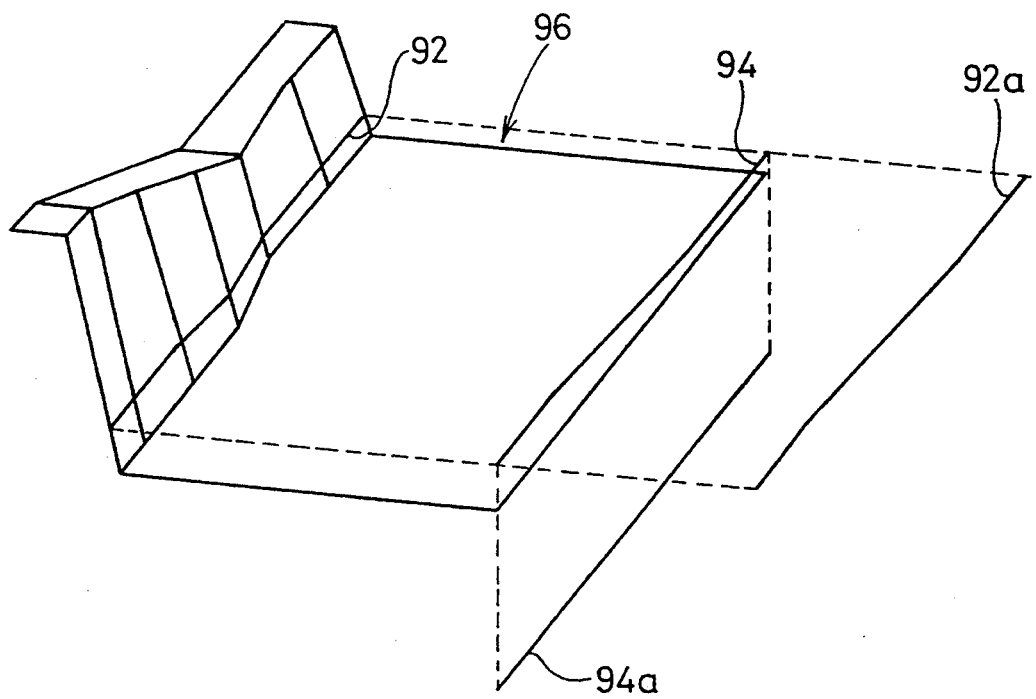
FIG. 24 is a diagram depicting the manner in which the further modification of the solid shape in FIG. 23 is terminated.

Then, line segments 92a and 94a are applied to a solid shape 96 of FIG. 23, as illustrated in FIG. 24. The line segment 92a cuts a wall surface of the solid shape 96 by applying the function 1. Thereafter, the wall surface of the solid shape 96 is cut with the line segment 92. By further applying the function 3 to the solid shape 96, the line segments 92a and 94a are combined so as to determine a line segment 94 as a composite line segment, and faces are created between the line segments 92 and 94. Further, faces are formed between the line segment 90 shown in FIG. 22 and the line segment 94 illustrated in FIG. 24. As a consequence, a solid shape 100 shown in FIG. 25 can be created.

Figure 25:
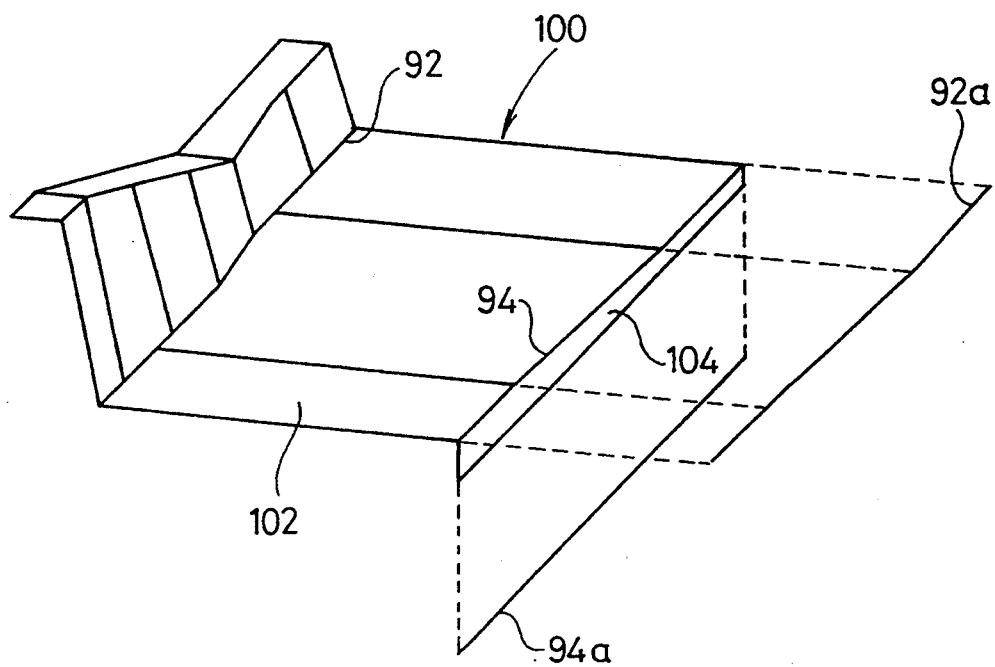
FIG. 25 is a diagram showing the manner in which the still further modification of the solid shape in FIG. 24 is finished.
Figure 26:
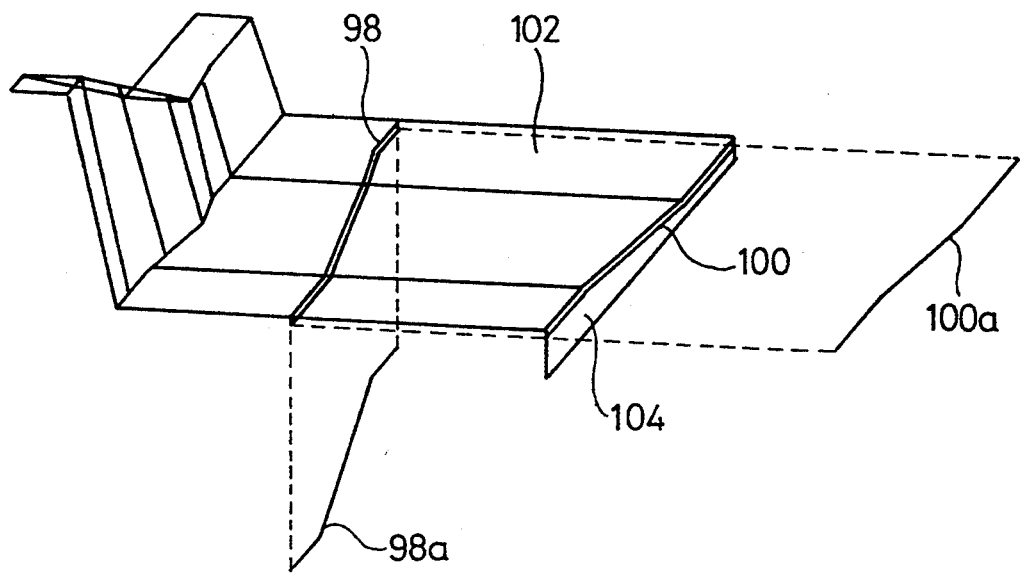
FIG. 26 is a diagram for describing the formation of difference in stepwise level in a plane of FIG. 25.

Referring to FIG. 26, faces 102 and 104 of the solid shape 100 depicted in FIG. 25 are cut with a line segment 98 (defined by projecting a line segment 98a) and a line segment 100 (defined by projecting a line segment 100a), respectively, by applying the function 1 to the solid shape 100 shown in FIG. 25. In addition, the line segments 98a and 100a are combined below the face 102 so as to obtain a composite line segment. Then, the connection of the position where the face 102 is cut with the line segment 98 to the composite line segment thus obtained is carried out by using a face. Further, the composite line segment and the line segment 100 are connected to each other by making use of a face. Thus, a solid shape 105 illustrated in FIG. 27 is created.

Figure 27:
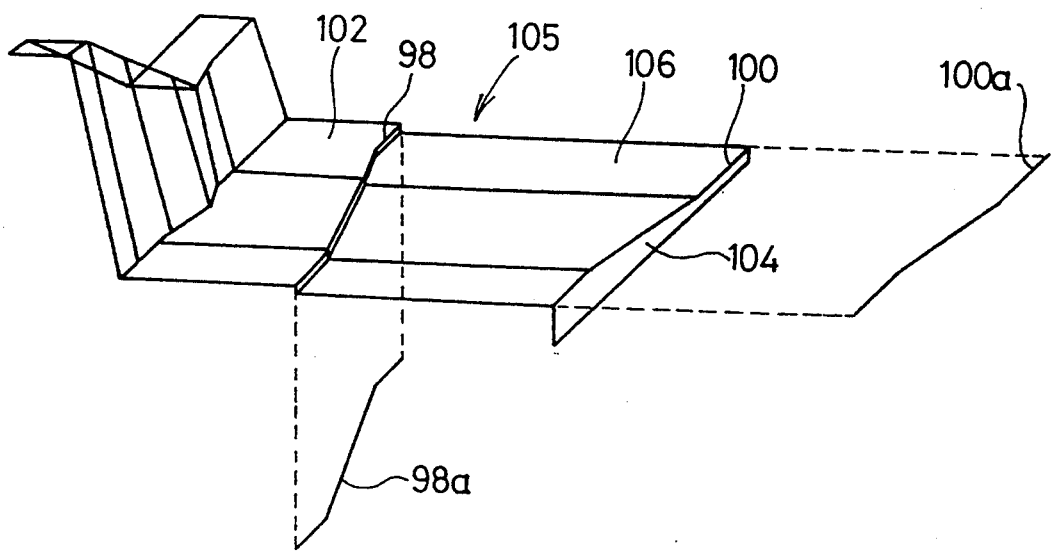
FIG. 27 is a diagram showing the manner in which the modification of the solid shape in FIG. 26 is completed.
Figure 28:
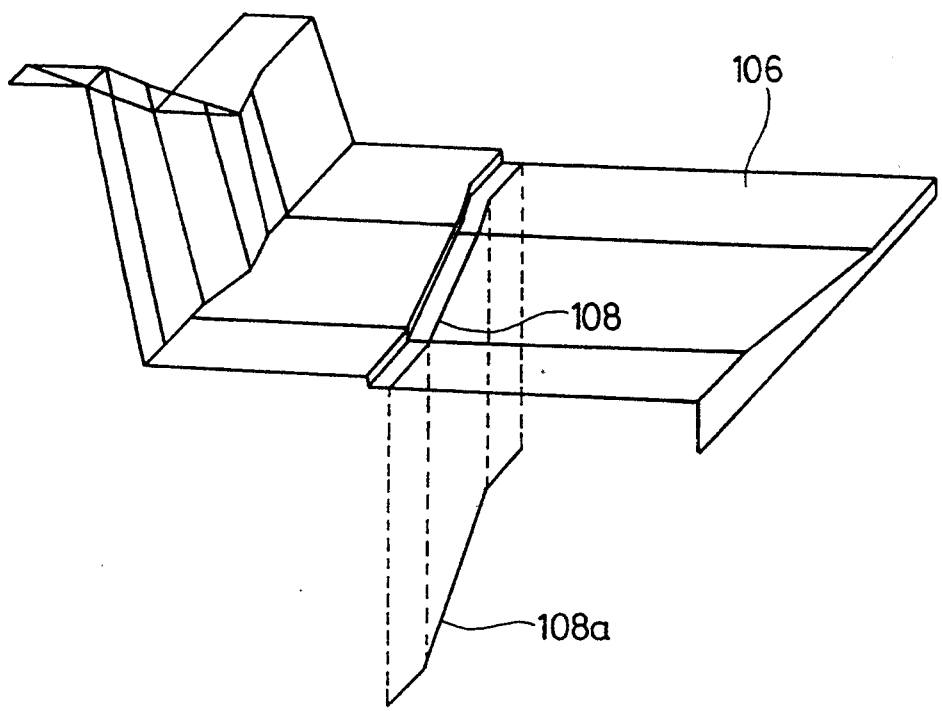
FIG. 28 is a diagram for describing the formation of the difference in stepwise level in FIG. 27 in an oblique manner.
Figure 29:
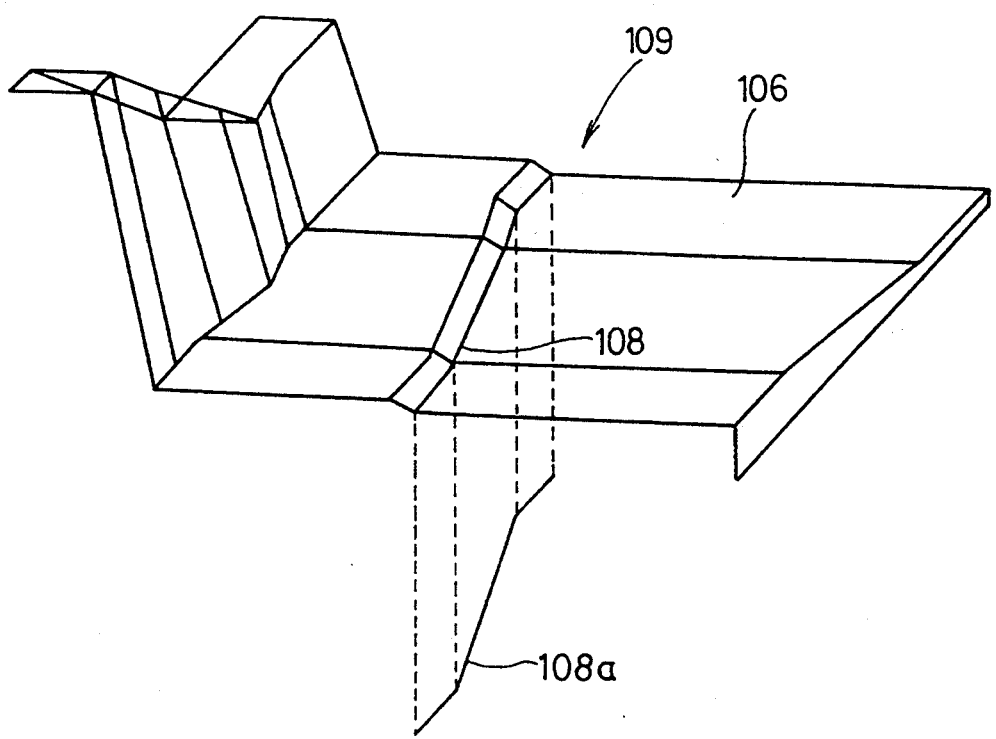
FIG. 29 is a diagram showing the manner in which the modification of the solid shape in FIG. 28 is completed.

To set difference in stepwise level formed by the line segment 98 to an inclined face as illustrated in FIG. 28 with respect to the solid shape 105 shown in FIG. 27, a predetermined position of a face 106 is cut with a line segment 108 which is the projection of line segment 108a created by the application of function 1 to the solid shape 105. Thereafter, the connection of the location where the face 102 is cut with the line segment 98 shown in FIG. 26, to the line segment 108 is carried out by a face. Thus, a solid shape 109 depicted in FIG. 29 is created.

According to the present invention, as has been described above, a solid model can easily be produced by creating shape models with a combination of respective solid shapes comprising small portions.

It is also possible to bring about an advantageous effect that the present invention can easily correspond to the change of design. More specifically, a portion to be changed is cut from an overall solid model to thereby create a small solid model, and modification is made to the small solid model. Thus, some modification is facilitated by connecting the small solid model thus modified to the overall solid model.

Further, the creation of the solid model can be performed by simply inputting a rough image of a graphic shape as data. It is therefore feasible to bring about advantageous effects that the burden on an operator can be reduced and an error in inputting of the image can also be reduced. Accordingly, the production of the shape data can be carried out at higher efficiency.

Furthermore, the solid model can easily be constructed by projecting line segments on the solid model as seen in the direction indicated by the arrows and connecting between line segments formed in the portions which intersect the projected line segments, with faces. It is also unnecessary to change individual line segments upon a change of design, thereby making it possible to reduce the number of design steps.

Having now fully described the invention, it will be apparent to those skilled in the art that many changes and modifications can be made without departing from the spirit or scope of the invention as set forth herein.

What is claimed is:

1. A method of generating a solid representation of an object in a system having storage and processing means, from data including data representing a two dimensional representation of the object, comprising the steps of:
    (a) dividing the two dimensional representation of the object by locating two dimensional portions, according to predetermined criteria, and defining the two dimensional portions;
    (b) defining a reference line for each said two dimensional portion;
    (c) defining, for each said two dimensional portion, a plurality of parallel cross-sectional sections relative to the two dimensional portion, each said cross-sectional section being a combination of connected line segments, wherein each said line segment is positioned in approximately correct relationship to said two dimensional portions reference line for defining a line segment-reference line relationship;
    (d) specifying orientation or positional data on said line segments of each said cross-sectional sections relative to said two dimensional portions reference line;
    (e) accurately rendering said line segment-reference line relationships, by using said orientation or positional data, thereby accurately rendering said cross-sectional sections;
    (f) rendering said two dimensional portions solid into three dimensional portions by referring to said accurately rendered cross-sectional sections; and
    (g) connecting smoothly said three dimensional portions.

2. The method according to claim 1, wherein one of said predetermined criteria is that the parallel cross-sectional sections are substantially similar to each other.

3. A method according to claim 2, wherein said step of rendering said two dimensional portions solid into three dimensional portions, includes defining surface data.

4. A method according to claim 2, wherein said line segment-reference line relationships includes an angular relationship between said line segment and said reference line.

5. A method according to claim 2, wherein said line segment-reference line relationship includes a distance between said line segment and said reference line.

6. A method according to claim 2, wherein said step of rendering said two dimensional portions solid into three dimensional portions, also includes defining surface data, and wherein said line segment-reference line relationship includes an angular relationship between said line segment and said reference line.

7. A method according to claim 6, wherein said line segment-reference line relationship further includes a distance between said line segment and said reference line.

8. A method according to claim 2, wherein said step of rendering said two dimensional portions solid into three dimensional portions, includes interpolating said plurality of cross-sectional sections for generating additional cross sections.

9. The method according to claim 1, wherein said step of rendering said two dimensional portions solid into three dimensional portions, includes defining surface data.

10. The method according to claim 1, wherein said line segment-reference line relationship includes an angular relationship between said line segment and said reference line.

11. A method according to claim 1, wherein said line segment-reference line relationship includes a distance between said line segment and said reference line.

12. A method according to claim 1, wherein said step of rendering said two dimensional portions solid into three dimensional portions, also includes defining surface data, and wherein said line segment-reference line relationship includes an angular relationship between said line segment and said reference line.

13. A method according to claim 12, wherein said line segment-reference line relationship further includes a distance between said line segment and said reference line.

14. The method according to claim 1, wherein said step of rendering said two dimensional portions solid into three dimensional portions, includes interpolating said plurality of cross-sectional sections for generating additional cross sections.

* * * * *